(12) United States Patent
Verbaas

(10) Patent No.: US 12,424,464 B2
(45) Date of Patent: Sep. 23, 2025

(54) RADIATION SHIELD

(71) Applicant: ASM IP Holding B.V., Almere (NL)

(72) Inventor: Melvin Verbaas, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 453 days.

(21) Appl. No.: 17/880,412

(22) Filed: Aug. 3, 2022

(65) Prior Publication Data
US 2022/0375772 A1 Nov. 24, 2022

Related U.S. Application Data

(60) Continuation of application No. 16/872,045, filed on May 11, 2020, now Pat. No. 11,417,545, which is a division of application No. 15/672,119, filed on Aug. 8, 2017, now Pat. No. 10,692,741.

(51) Int. Cl.
| | |
|---|---|
| *H01L 21/67* | (2006.01) |
| *C23C 16/458* | (2006.01) |
| *C23C 16/48* | (2006.01) |
| *H01L 21/687* | (2006.01) |
| *H01J 37/32* | (2006.01) |

(52) U.S. Cl.
CPC .... *H01L 21/67115* (2013.01); *C23C 16/4586* (2013.01); *C23C 16/481* (2013.01); *C23C 16/488* (2013.01); *H01L 21/67017* (2013.01); *H01L 21/67103* (2013.01); *H01L 21/67161* (2013.01); *H01L 21/6719* (2013.01); *H01L 21/67248* (2013.01); *H01L 21/68735* (2013.01); *H01L 21/68785* (2013.01); *H01J 37/32449* (2013.01)

(58) Field of Classification Search
CPC .............. C23C 16/481; C23C 16/4586; H01L 21/67248; H01L 21/68785; H01L 21/67102; H01L 21/67115
See application file for complete search history.

(56) References Cited

U.S. PATENT DOCUMENTS

| | | | |
|---|---|---|---|
| 6,035,101 A | 3/2000 | Sajoto et al. | |
| 6,165,271 A | 12/2000 | Zhao et al. | |
| 6,589,352 B1 * | 7/2003 | Yudovsky | C30B 31/14 |
| | | | 118/728 |
| 8,506,713 B2 | 8/2013 | Takagi | |
| 9,167,625 B2 | 10/2015 | Shero et al. | |
| 10,932,323 B2 | 2/2021 | Burrows et al. | |
| 2002/0104751 A1 | 8/2002 | Drewery et al. | |
| 2003/0051665 A1 * | 3/2003 | Zhao | C23C 16/5096 |
| | | | 712/42 |
| 2004/0169032 A1 | 9/2004 | Murayama et al. | |
| 2005/0183827 A1 | 8/2005 | White et al. | |
| 2005/0284991 A1 | 12/2005 | Saez | |
| 2009/0280248 A1 | 11/2009 | Goodman et al. | |

(Continued)

FOREIGN PATENT DOCUMENTS

JP 2006237516 A 9/2006

*Primary Examiner* — Joseph A Miller, Jr.
(74) *Attorney, Agent, or Firm* — Snell & Wilmer L.L.P.

(57) ABSTRACT

A radiation shield and an assembly and a reactor including the radiation shield are disclosed. The radiation shield can be used to control heat flux from a susceptor heater assembly and thereby enable better control of temperatures across a surface of a substrate placed on a surface of the susceptor heater assembly.

17 Claims, 20 Drawing Sheets

(56) References Cited

U.S. PATENT DOCUMENTS

2010/0317197 A1* 12/2010 Lind .................. C23C 16/4401
438/758
2013/0126515 A1* 5/2013 Shero ................ H01L 21/67115
219/448.11
2015/0292815 A1 10/2015 Ranish

* cited by examiner

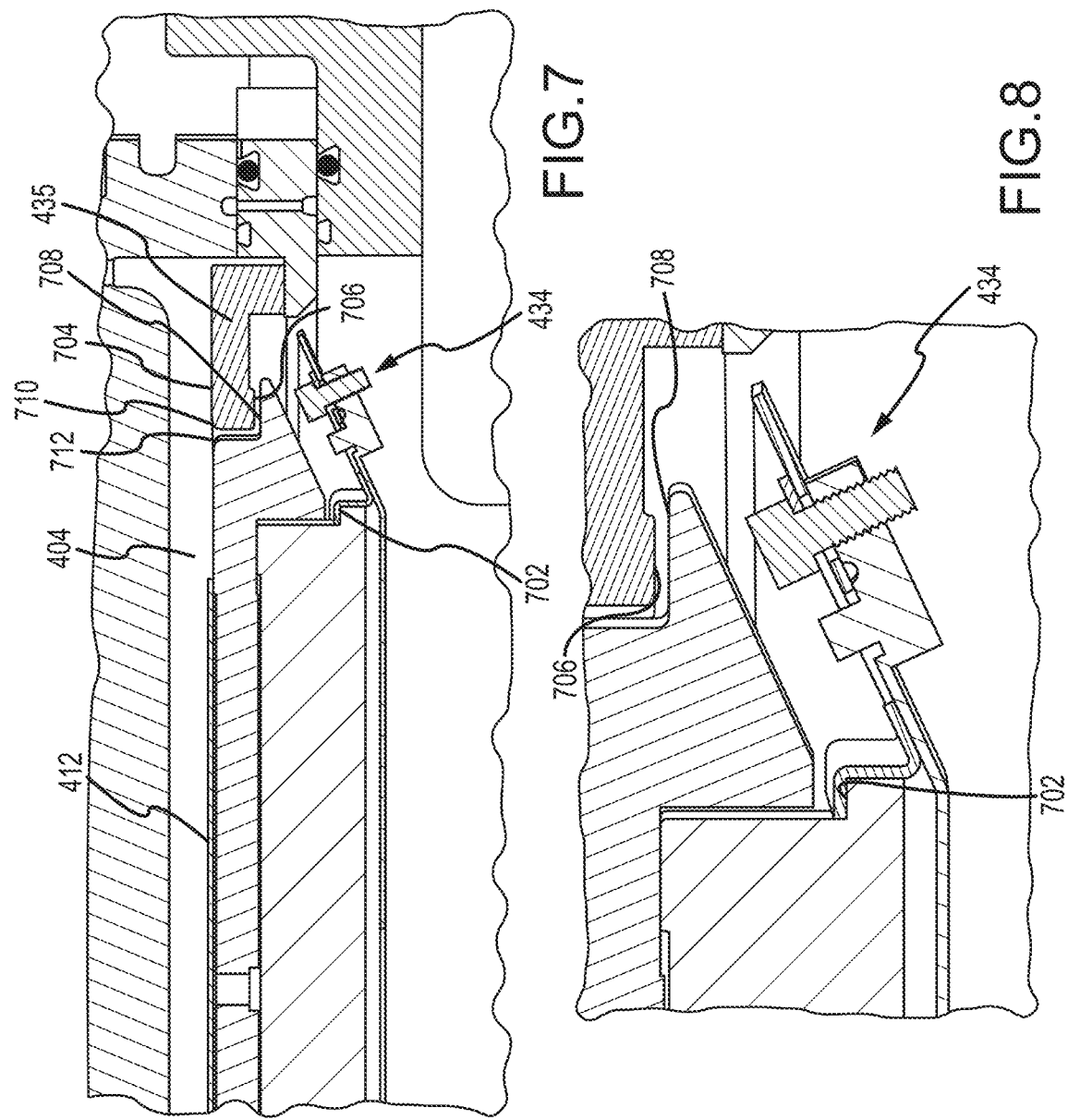

RADIATION SHIELD

CROSS-REFERENCE TO RELATED APPLICATIONS

This application is a continuation of, and claims priority to and the benefit of, U.S. patent application Ser. No. 16/872,045, filed May 11, 2020 and entitled "RADIATION SHIELD," which is a divisional of, and claims priority to and the benefit of, U.S. patent application Ser. No. 15/672,119, filed Aug. 8, 2017 and entitled "RADIATION SHIELD," now U.S. Pat. No. 10,692,741 issued on Jun. 23, 2020, which are hereby incorporated by reference herein.

FIELD OF INVENTION

The disclosure generally relates to apparatus for gas-phase processes. More particularly, exemplary embodiments of the present disclosure relate to radiation shields and apparatus including the shields that can be used in gas-phase reactors.

BACKGROUND OF THE DISCLOSURE

A gas-phase reactor often includes a reaction chamber, a susceptor to support one or more substrates within the reaction chamber, a gas distribution system, and an opening, such as gate valve, to allow loading and unloading of the substrates into or out of the reaction chamber and sealing of the reaction chamber during processing. During various gas-phase processes, the substrates can be heated to facilitate a reaction on a surface of the substrates—especially relative to the reaction on a surface of the reaction chamber—by heating the susceptor heater assembly. The substrates can be heated using a susceptor heater assembly that includes the susceptor and a heating device, which can be embedded in a portion of the susceptor. A reactor in which the substrates are heated, but in which the reaction chamber walls are not heated or are heated to a much lesser degree, is often referred to as a cold-wall reactor.

Cold-wall reactors can suffer from uneven heat distribution across a surface of a susceptor heater assembly and consequently across one or more substrates on the susceptor heater assembly. The uneven heat distribution can lead to temperature difference across a substrate during processing, which in turn, can lead to uneven film deposition, etch, clean, or the like processing on the substrate surfaces. At least part of the reason for the uneven heat distribution can arise from uneven heat flux from the susceptor heater assembly. Accordingly, improved apparatus and methods for providing heat across a surface of a susceptor heater assembly and across surfaces of one or more substrates on the susceptor heater assembly, while reducing uneven heat flux from the susceptor heater assembly and/or substrate, are desired.

SUMMARY OF THE DISCLOSURE

Various embodiments of the present disclosure provide an improved method and system for mitigating variances in heat flux from a susceptor heater assembly. By mitigating the variance of the heat flux, a variance of temperatures on a substrate residing on the susceptor heater assembly can be reduced, and therefore, process variation (e.g., deposition rate, etch rate, clean rate, or the like) across a substrate surface and/or across multiple substrate surfaces processed at one time can be reduced. As a result, a quality of substrate processing can be increased.

In accordance with at least one exemplary embodiment of the disclosure, a radiation shield for use in a reaction chamber of a reactor is provided. An exemplary radiation shield includes a plate comprising a first section and a second section, wherein the first section comprises an annular disc having an inner perimeter and an outer perimeter, and wherein the second section comprises a hollow frusto shape. The device further includes an attachment device for attaching the plate to a susceptor heater assembly within the reaction chamber. In accordance with various aspects of these embodiments, the inner diameter ranges from about 80 mm to about 90 mm, about 160 mm to about 170 mm, or about 240 mm to about 250 mm. In accordance with further aspects, the outer diameter ranges from about 300 mm to about 400 mm, about 450 mm to about 550, or about 500 to about 600. In accordance with further aspects, the inner perimeter does not contact the susceptor heater assembly when the radiation shield is placed in a position for processing substrates. In accordance with further aspects, the attachment device includes a slidable member to facilitate easy installation and/or removal of the radiation shield. The slidable member can include a structure, such as a block or a rivet to receive a fastener, such as a threaded fastener (e.g., a bolt or a screw) or other form of fastener. The slidable member can include one or more recesses to receive an alignment pin and/or a fastener, such as a threaded fastener. The slidable member can be attached to the plate at one end and to the susceptor heater assembly at the other end. In accordance with yet additional aspects, the radiation shield includes an alignment pin to align the attachment device relative to the susceptor heater assembly.

In accordance with another embodiment of the disclosure, a radiation includes a substantially planar, substantially annular plate. An inner diameter of the plate can range from about 80 mm to about 90 mm, about 160 mm to about 170 mm, or about 240 mm to about 250 mm. The outer diameter ranges from about 300 mm to about 330 mm, about 450 mm to about 550, or about 500 to about 600. In accordance with various aspects of this embodiment, the annular plate includes one or more protrusions extending from the outer diameter. The protrusions can be used to attach the annular plate to, for example, a flow control ring, as discussed in more detail below.

In accordance with further exemplary embodiments of the disclosure, the radiation shield is coupled to a portion of a susceptor heater assembly and/or a flow control ring that is coupled to the susceptor heater assembly. When the radiation shield is attached to the susceptor heater assembly and/or a flow control ring, the shield can travel with the susceptor heater assembly as the susceptor heater assembly moves within the reactor—e.g., from a load/unload position to a processing position—while maintaining a desired position relative to the susceptor. The combination of the radiation shield and the susceptor heater assembly and/or a flow control ring can be configured to provide desired heat flux patterns and/or gas flow patterns within the reactor.

In accordance with additional exemplary embodiments of the disclosure, an apparatus for supporting a substrate during a reaction process includes a susceptor heater assembly, including a body including an outer surface, a radiation shield, and, optionally a flow control ring. The radiation shield can be attached to the outer surface and/or to the flow control ring that is attached to the outer surface. The radiation can be the same or similar to those described above and elsewhere in this disclosure. The apparatus can further comprise a cap overlying a top surface of the susceptor heater assembly. Additionally or alternatively, the apparatus can include one or more lift pins. The lift pins can be received within a space of the radiation shield that is defined by the inner perimeter of a plate and can be received within the susceptor heater assembly. The susceptor heater assembly can further include an inner region that includes a stem. In accordance with various aspects of these embodiments, the radiation shield does not contact the inner region or stem when the radiation shield is placed in a position for processing substrates. In accordance with further aspects, the inner perimeter does not contact the susceptor heater assembly when the radiation shield is placed in a position for processing substrates. In accordance with yet further aspects, the outer surface comprises a ledge. The radiation shield can be engaged with and/or rest on the ledge.

In accordance with at least one further exemplary embodiment of the disclosure, a method of using a radiation shield within a reaction chamber of a reactor includes the steps of providing a susceptor heater assembly having an outer surface comprising a ledge, attaching or otherwise engaging a radiation shield to the ledge, using a tool to measure a distance between an outer perimeter of the radiation shield and an interior surface of a reaction chamber, and adjusting placement of the radiation shield based on the measurement.

In accordance with another exemplary embodiment of the disclosure, a method of using a radiation shield within a reaction chamber of a reactor includes the steps of providing a susceptor heater assembly having an outer surface, providing a flow control ring coupled to the outer surface, and attaching or otherwise engaging a radiation shield to the flow control ring.

In accordance with yet additional exemplary embodiments of the disclosure, a method includes the steps of supporting a susceptor on a heater assembly, moving the susceptor heater assembly from a first position to a second position, processing a substrate, and moving the susceptor heater assembly from the second position to the first position.

Both the foregoing summary and the following detailed description are exemplary and explanatory only and are not restrictive of the disclosure or the claimed invention.

BRIEF DESCRIPTION OF THE DRAWING FIGURES

A more complete understanding of the embodiments of the present disclosure may be derived by referring to the detailed description and claims when considered in connection with the following illustrative figures.

FIGS. 1A, 1B, and 1C illustrate temperature measurement variation across a surface of a substrate.

FIG. 7 illustrates a portion of a reactor including a radiation shield in greater detail accordance with at least one embodiment of the disclosure.

FIG. 8 illustrates a portion of a reactor including a radiation shield in greater detail accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help to improve understanding of illustrated embodiments of the present disclosure.

DETAILED DESCRIPTION OF EXEMPLARY EMBODIMENTS OF THE INVENTION

The description of exemplary embodiments of methods and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

Any ranges indicated in this disclosure may include or exclude the endpoints. Additionally, any values of variables indicated (regardless of whether they are indicated with "about" or not) may refer to precise values or approximate values and include equivalents, and may refer to average, median, representative, majority, or the like.

The radiation shield, apparatus, and method described herein provide improved temperature uniformity across a susceptor heater assembly and a substrate on the susceptor heater assembly during processing, compared to use of the same susceptor heater assembly without a radiation shield and/or with a radiation shield not having features described herein, such as a radiation shield with different features and/or that may have a smaller or different opening.

Figure 1A:
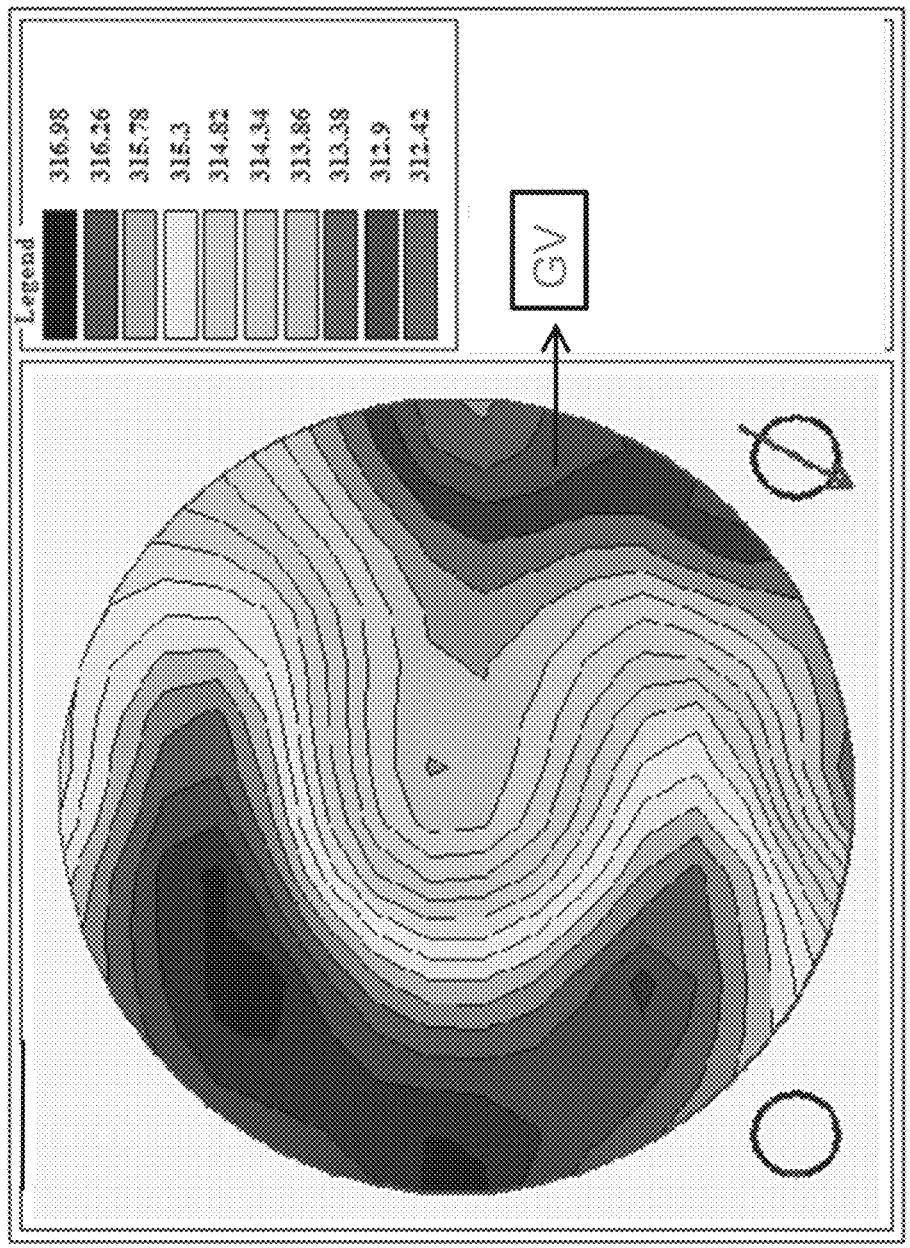
Figure 1B:
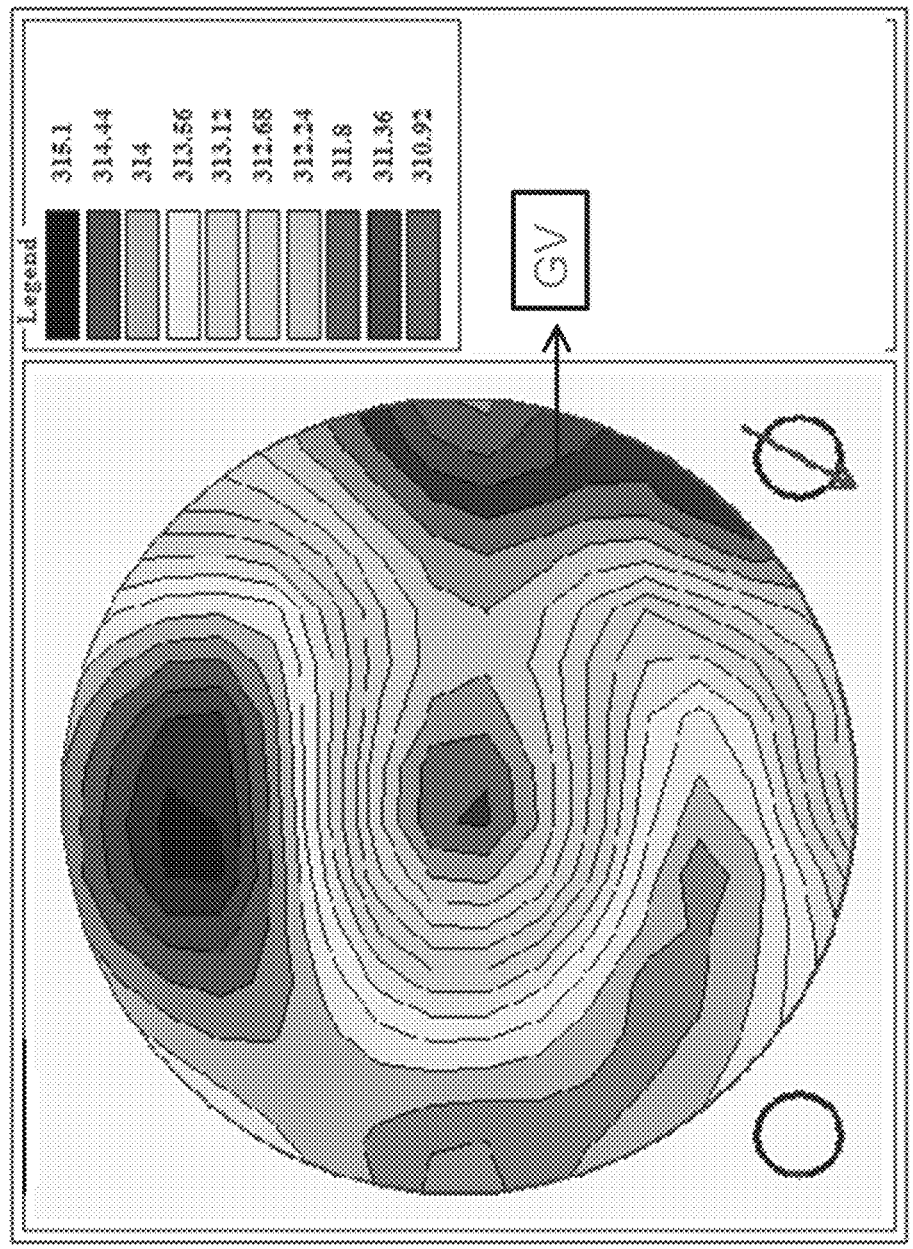
Figure 1C:
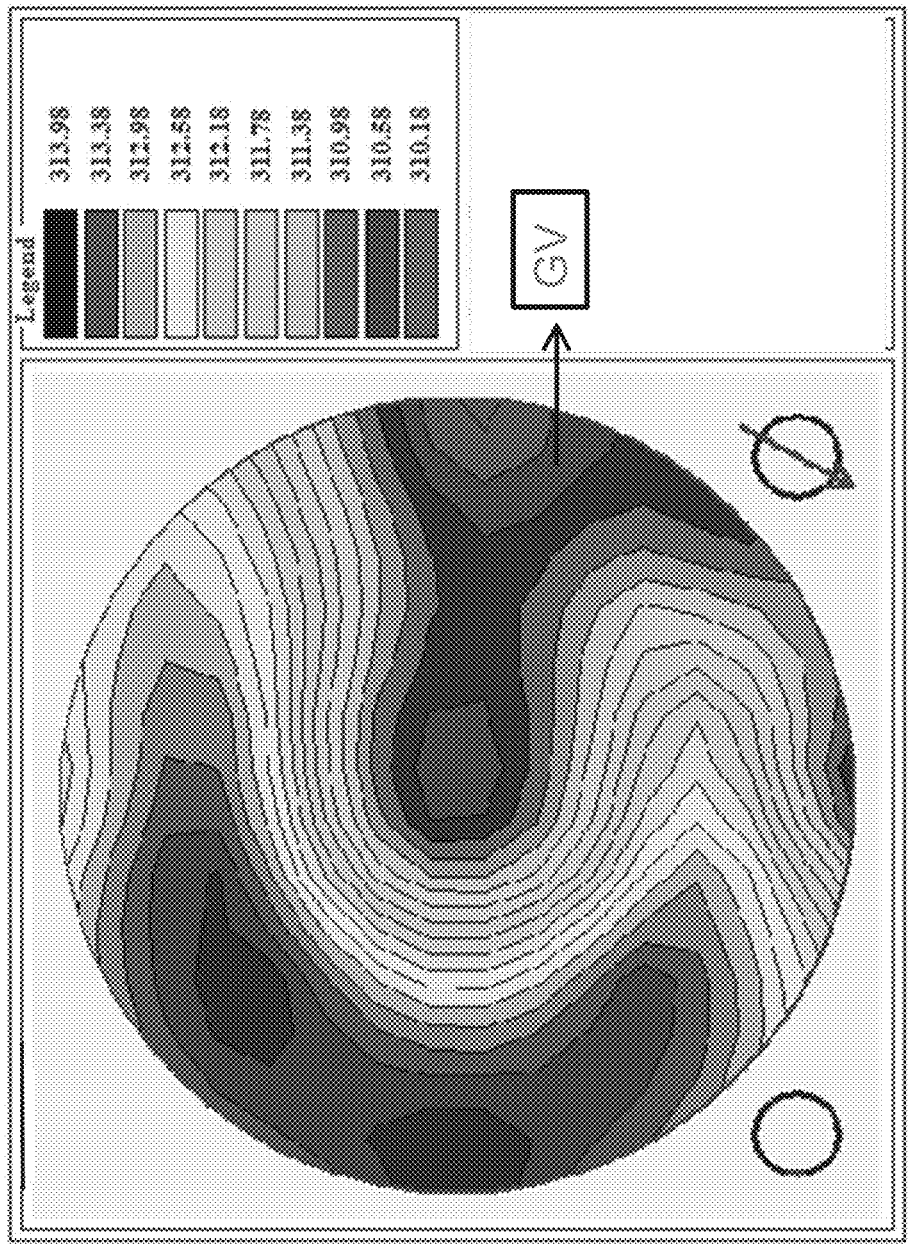

FIGS. 1A, 1B, and 1C illustrate temperature profiles across a surface of a susceptor within a reaction chamber of a reactor that includes a gate valve. The temperatures represented in the profiles were measured using wireless thermocouples on a substrate. The substrate was oriented in the reaction chamber, such that the top of the wafer (in the figures) was near the gate valve. The illustrations show that the gate valve acts as a heat sink and can deleteriously affect a temperature profile across a surface of a substrate—e.g., increase the temperature variance across the surface. As illustrated, the temperature variance across the substrate surface can increase with increasing temperature.

Figure 2:
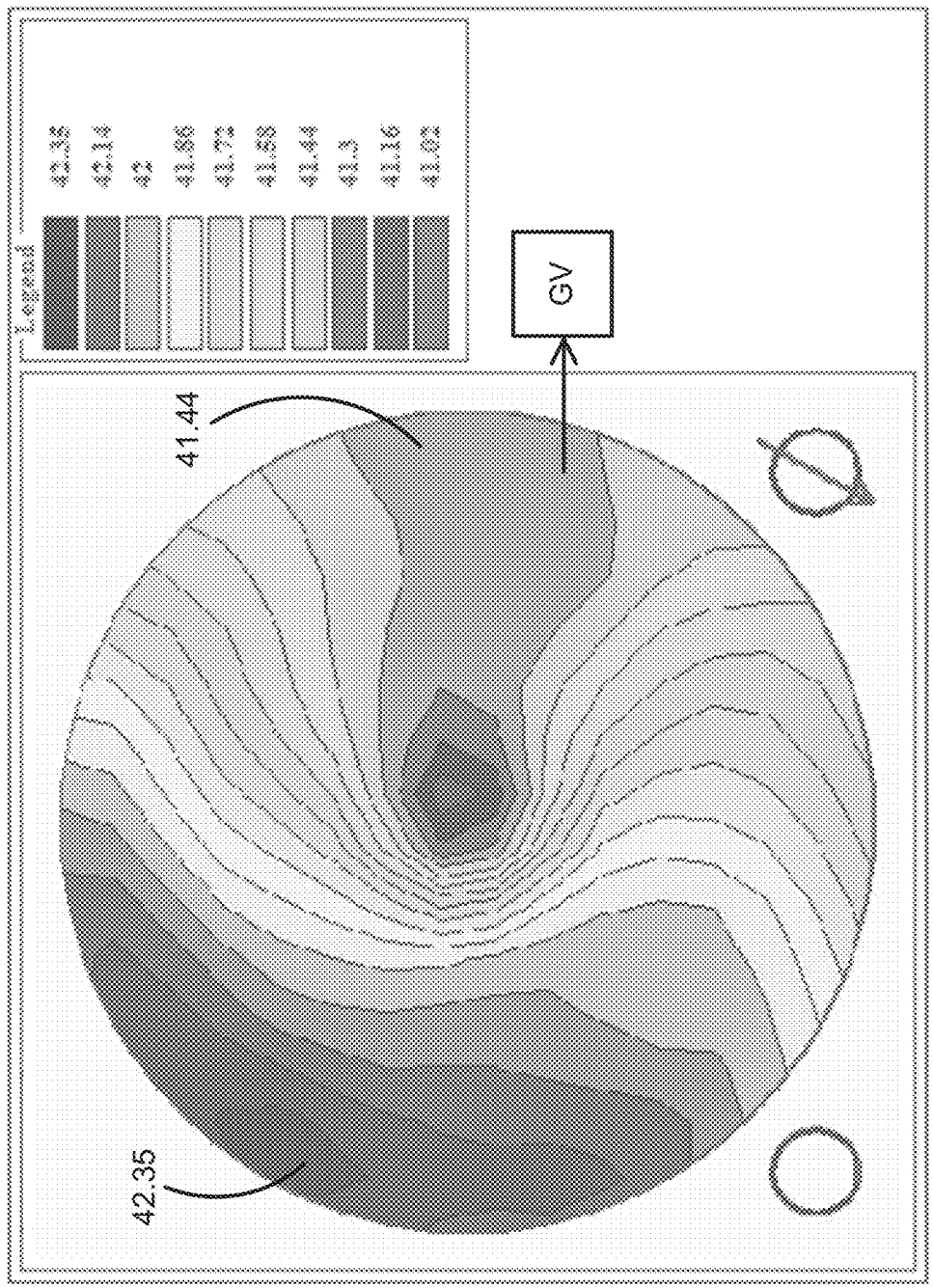
FIG. 2 illustrates a deposition profile of material deposited onto a substrate.

FIG. 2 illustrates the effect of temperature variation across a surface of the substrate on film deposition rates of material on the surface. The deposition profile illustrated in FIG. 2 corresponds with the temperature profiles of FIGS. 1A-1C. That is, the deposition rate is highest in areas corresponding to higher temperatures and lower in areas corresponding to lower temperatures.

Figure 3:
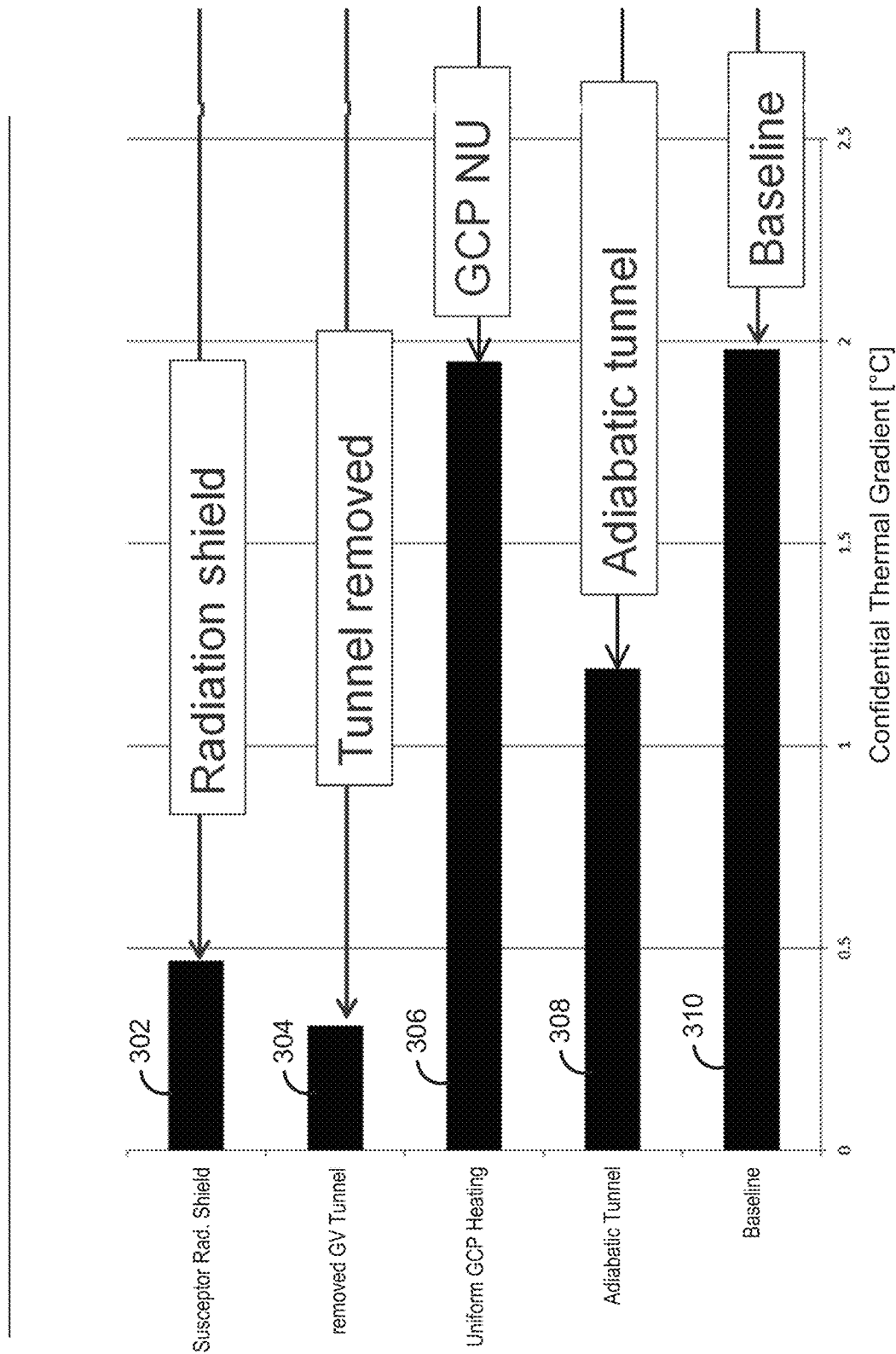
FIG. 3 illustrates simulations of temperature variation across a surface within a reaction chamber.

FIG. 3 illustrates simulations of temperature differentials across a surface of a susceptor heater assembly (e.g., a susceptor heater assembly having titanium cap with a top surface having a diameter of about 400 mm) under various conditions. The simulations represent a susceptor heater assembly temperature of about 475° C., in a cold-wall reactor. Bar 302 illustrates simulated temperature differential across a surface of the susceptor heater assembly when a radiation shield in accordance with at least one embodiment of the disclosure is used. Bar 304 illustrates a simulated temperature differential across a surface of the susceptor heater assembly when a gate valve is removed and replaced with a brick. Bars 306-310 illustrate simulated temperature differentials across a surface of the susceptor heater assembly when no radiation shield is present within a reaction chamber. The simulations illustrate that when a gate valve is present, the use of a radiation shield as described herein provides better temperature uniformity across a surface of the susceptor heater assembly.

Figure 4:
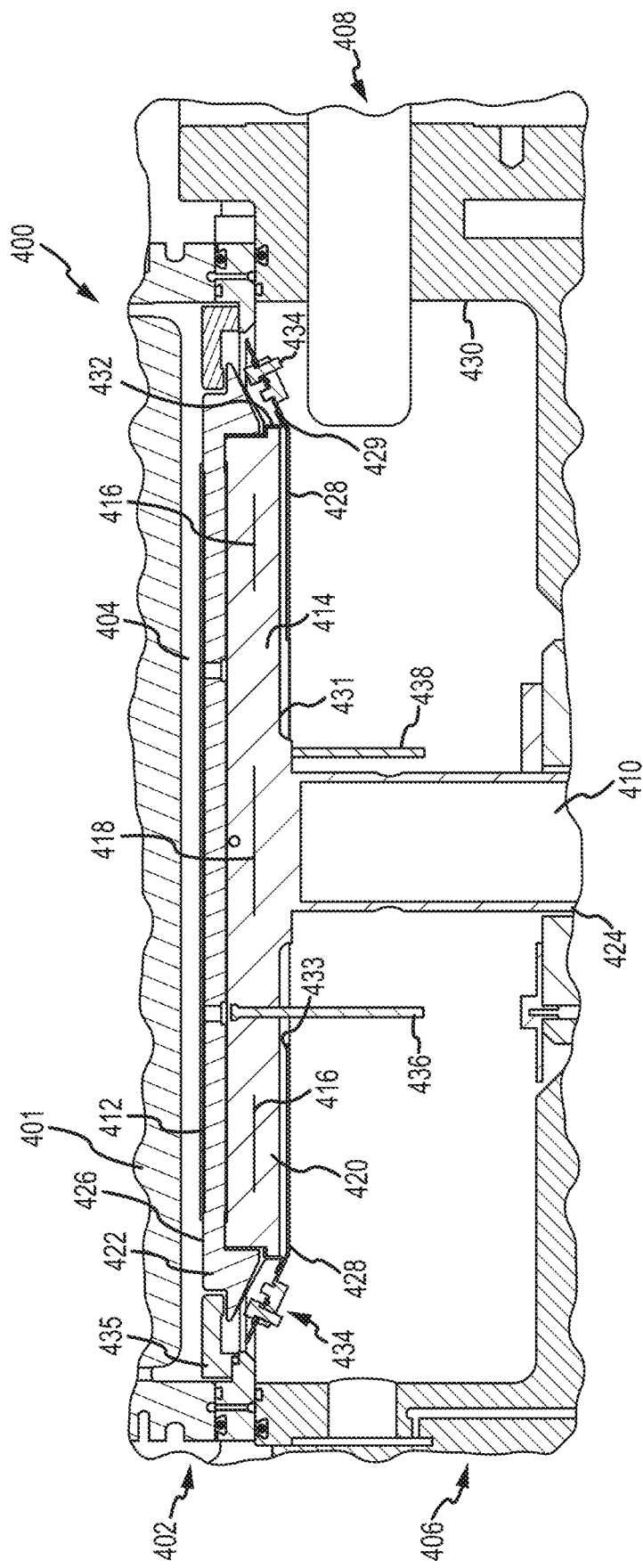
FIG. 4 illustrates a portion of a reactor including a radiation shield in accordance with at least one embodiment of the disclosure.
Figure 6:
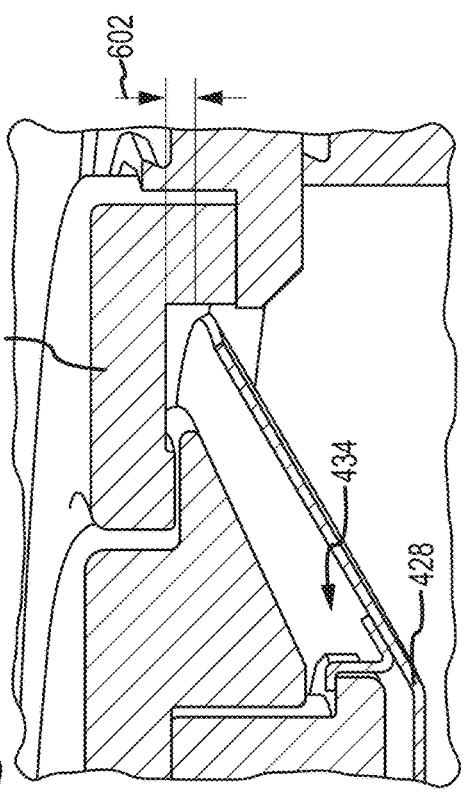
FIG. 6 illustrates a portion of a reactor including a radiation shield in greater detail accordance with at least one embodiment of the disclosure.
Figure 5:
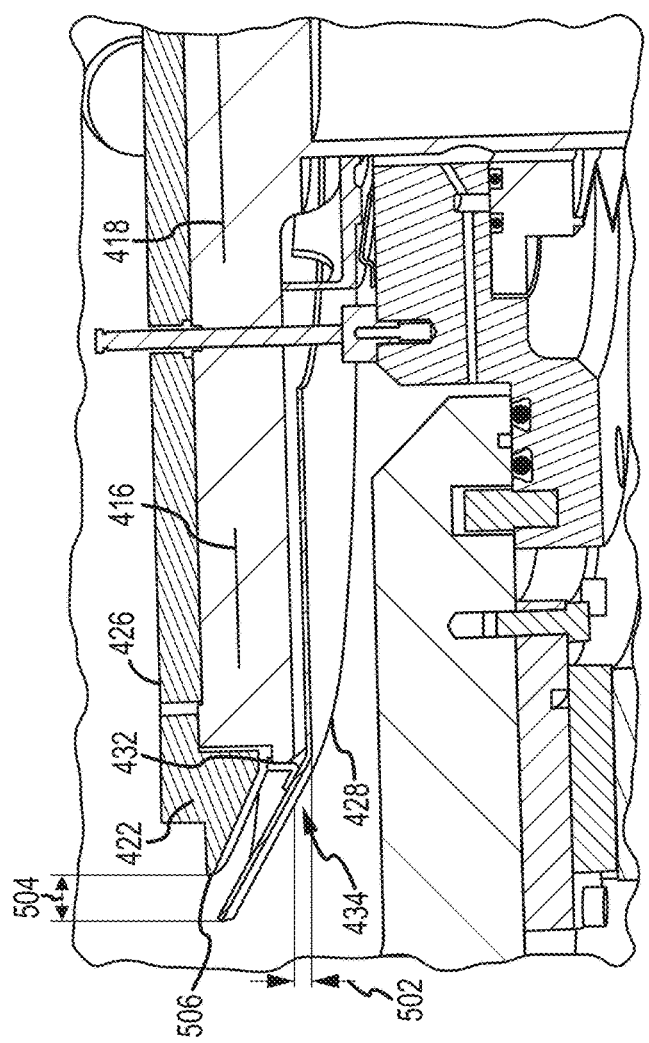
FIG. 5 illustrates a portion of a reactor including a radiation shield in greater detail accordance with at least one embodiment of the disclosure.

Turning now to FIG. 4, a cross-sectional view of a portion of a reactor 400 in accordance with at least one embodiment of the disclosure is illustrated. Reactor 400 can be a stand-alone reactor or part of a cluster tool. Further, reactor 400 can be dedicated to a deposition process, etch, clean, or the like process, or reactor 400 can be used for multiple processes. For example, reactor 400 can include a reactor typically used for chemical vapor deposition (CVD), such as epitaxial layer deposition. Reactor 400 can include remote or direct thermal excitation, direct plasma, and/or remote plasma apparatus (not illustrated). An exemplary reactor suitable for reactor 400 is an atomic layer deposition reactor available from ASM International.

While exemplary reactor 400 is illustrated with a single chamber, described below, it will be appreciated that any suitable number of process chambers may be included in a processing tool, so that substrates may be transferred between process chambers without being exposed to ambient conditions. For example, some processing tools can include just one chamber, while other processing tools include two or more chambers. In these examples, each reaction chamber can include only a single region or a plurality of regions. While not shown in FIG. 4, various load locks, load ports, and substrate transfer handling robots can be used to transfer substrates between ambient conditions and a substrate processing chamber before, during, and after substrate processing.

Reactor 400 includes an upper region 402, including a reaction zone or processing region 404, and a lower region 406, including a substrate loading region 408, where substrate transfer operations are performed. In some embodiments, a gate valve (not shown) may be coupled to substrate transfer opening 408, so that reactor 400 can be isolated from other portions of a semiconductor processing tool and/or so that reactor 400 can be pumped down to a pressure below an ambient pressure (e.g., to a low pressure state).

Reactor 400 also includes a movable pedestal 410 used to support a substrate within reactor 400. FIG. 4 illustrates pedestal 410 in a processing position within upper region 402. Pedestal 410 can suitably be placed in a lowered position as a part of transferring a substrate 412 in or out of reactor 400.

Pedestal 410 includes a susceptor heater assembly 414 for supporting one or more substrates 412. Susceptor heater assembly 414 includes one or more heating devices 416, 418 to adjust a temperature of the substrate before, during, and/or after substrate processing. In some embodiments, one or more heating devices 416, 418 include a resistive platen heater. Susceptor heater assembly 414 also includes a base 420 and a substrate supporting portion 422. In some embodiments, base 420 includes one or more channels configured to retain one or more heating devices 416, 418, such as resistive heating elements, which can be positioned within base 420. Exemplary base 420 also includes a ledge 702, as illustrated in FIGS. 7 and 8.

In accordance with further examples, substrate supporting portion 422 is a removable cap that rests on base 420. Base 420 can be formed of, for example, stainless steel, aluminum, titanium, and/or aluminum nitride. Substrate support portion or cap 422 can be formed of, for example, titanium, stainless steel, aluminum, titanium, and/or aluminum nitride. Substrate support portion 422 includes a top surface 426 configured to support substrate 412. In some embodiments, a substrate pocket to receive substrate 412 is formed into surface 426. In some other embodiments where heater assembly 414 includes a one-piece heater, a substrate pocket may be formed into an upper surface of the one-piece heater, so that substrate 412 rests directly on the one-piece heater. Processing region 404 can be defined as the area between top surface 426 and a gas distribution system 401, which is configured to provide process gasses to processing region 404.

Although gas distribution system 401 is illustrated in block form, gas distribution system 401 can be relatively complex and be designed to mix vapor (gas) from various sources (not illustrated) and/or carrier/purge gases from one or more sources (not illustrated) prior to distributing the gas mixture to processing region 404. Further, gas distribution system 401 can be configured to provide vertical (as illustrated) or horizontal flow of gasses to processing region 404. An exemplary gas distribution system is described in U.S. Pat. No. 8,152,922 to Schmidt et al., issued Apr. 10, 2012, entitled "Gas Mixer and Manifold Assembly for ALD Reactor," the contents of which are hereby incorporated herein by reference, to the extent the contents do not conflict with the present disclosure. By way of example, gas distribution system 401 can include a showerhead.

Heating devices 416, 418 can form heating zones within base 420 and on surface 426 of substrate supporting portion 422. The heating zones can be controlled independently. For example, susceptor heater assembly can include two or more heated zones that are independently controlled—e.g., using a controller described in more detail below in connection with FIG. 13.

In some other embodiments, susceptor heater assembly 414 is a one-piece heater, multiple pieces fused/welded together, or a heater separable from a substrate support. Susceptor heater assembly 414 is mounted on an elevator 424 so that substrate 412 can be raised and lowered. In some embodiments, heater assembly 414 is welded to elevator 424.

Reactor 400 includes a radiation shield 428 to reduce heat transfer from susceptor heater assembly 414 to a wall (e.g., wall 430) of reactor 400 and/or control heat flux from susceptor heater assembly 414 to an environment surrounding susceptor heater assembly 414. As noted above, substrate loading region 408, or, more particularly, a gate valve within substrate loading region 408 can cause increased non-uniformity of temperatures across surface 426 and substrate 412. This non-uniformity can be reduced using a radiation shield as described herein.

Radiation shield 428 is configured to reflect at least a portion of thermal radiation emitted from susceptor heater assembly 414 back toward susceptor heater assembly 414. In some embodiments, radiation shield 428 is configured to reflect thermal radiation and/or heat emitted by susceptor heater assembly 428 to at least two different sides of susceptor heater assembly 414. For example, FIG. 4 illustrates radiation shield 428 adapted to reflect some of the thermal radiation and/or heat emitted from bottom surface 431 and/or side surface 432 of susceptor heater assembly 414 back to susceptor heater assembly 414. This can reduce power consumption by heater assembly 414 and/or reduce within-substrate temperature non-uniformities that may result from an uneven radiation capture and/or reflection environment near susceptor heater assembly 414. As illustrated in FIG. 4, radiation shield 428 can be configured to extend beyond heater assembly 414, so that thermal radiation and/or heat is reflected to side and/or bottom surfaces of heater assembly 414. While creating non-uniformity of temperatures and/or processing may be a goal, this same arrangement may be used reduce power consumption and/or to exaggerate a non-uniformity as may be desired during processing of a substrate.

Radiation shield 428 is shaped and sized so that radiation shield 428 is separated from susceptor heater assembly 414 by a gap. Spacing radiation shield 428 and susceptor heater assembly 414 can help maintain an even radiation capture environment around susceptor heater assembly 414. It will be appreciated that a distance separating radiation shield 428 from susceptor heater assembly 414 may vary according to processing conditions (e.g., susceptor heater assembly temperatures, process pressures, etc.). For example, as pressure increases, thermal convection and/or conduction heat transfer processes may affect temperature fields within the substrate. In the illustrated example, a vertical gap 502 that defines a space between bottom surface 431 and a top surface 433 of radiation shield 428 and a horizontal gap 504 defines a space between side surface 506 of susceptor heater assembly 414 (e.g., of substrate supporting portion 422) and radiation shield 428. Vertical gap 502 can be between 5 and 20 mm, between 10 and 20 mm, or between 0.5 mm and 25 mm; horizontal gap 504 can between 5 and 15 mm, 7 and 12 mm, or between 0.5 and 25 mm. In one implementation, vertical gap 502 is approximately 17.25 mm, while horizontal gap 504 is approximately 9 mm. However, unless otherwise noted, shield 428 can be positioned any suitable distance from the bottom surface 431 and the side surface 506 without departing from the spirit and scope of the disclosure.

In some embodiments, such gaps define a constant separation between radiation shield 428 and susceptor heater assembly 414 within an acceptable tolerance (e.g., 0.5 mm or less). Such constant separation may provide a uniform radiation capture and/or reflection environment for susceptor heater assembly 414, potentially resulting in more uniform temperature profile within susceptor heater assembly 414 and/or substrate 412, compared to a reactor with no shield or a shield of another configuration. For example, in a scenario where a circularly symmetric substrate is supported on a circularly symmetric substrate heater assembly, positioning a radiation shield to create a circularly symmetric radiation capture and/or reflection environment around the susceptor heater assembly can result in a circularly symmetric temperature profile within the substrate. In turn, a temperature of the substrate, measured at a fixed radial distance from a center of the substrate, may be independent of polar angle.

In accordance with further examples of the disclosure, a space 602 between radiation shield 428 and a portion of the reactor, such as quartz spacer or isolation device (or flow control ring) 435, may be sized to provide a preselected thermal radiation reflectance from radiation shield 428, while also providing a predetermined gas flow conductance between upper processing region 404 and lower region 406 when the pedestal is in a raised position, such as during substrate processing. Thus, space 602 can be sized to provide a desired radiation capture and/or reflection environment for susceptor heater assembly 414 without sealing radiation shield 428 to processing region 404. This may provide differential pumping via space 602 among other portions of reactor 400. In some embodiments, however, radiation shield 428 is configured to fit snugly against processing region 404. In one non-limiting example, space 602 may be approximately 9 mm to 20 mm, and preferably 13 mm in one implementation. Specifically, isolation device 435 may be positioned to have a first surface 704 that is co-planar with surface 426, a second surface 706 that parallels a first portion 708 of cap 422, and a third surface 710 that parallels a second 712 portion of cap 422 to provide a tortuous gas-flow path between processing chamber 404 and substrate loading region 408.

It will be appreciated that, in some embodiments, such separation between radiation shield 428 and susceptor heater assembly 414 can vary. For example, separation between susceptor heater assembly 414 and radiation shield 428 can vary locally to offset emissivity variations of susceptor heater assembly 414 and/or radiation shield 428 and/or to accommodate various fittings, sensors, and/or other hardware features. For example, FIG. 4 depicts a sloping edge 429 of radiation shield 428, which may assist with clearance of various hardware fittings within lower region 406 as susceptor heater assembly 414 is raised and lowered. In some embodiments, a distance between sloping edge and susceptor heater assembly 414 may be less than a distance defining vertical gap 502 and/or horizontal gap 504.

In accordance with various embodiments of the disclosure, radiation shield 428 is coupled to base 420 and/or substrate supporting portion 422 of heater assembly 414. In the illustrated examples of FIGS. 4-8, radiation shield is coupled to ledge 702 of base 420. Radiation shield can rest on ledge 702. In accordance with some exemplary embodiments, one or more attachment devices 434 are used to attach radiation shield 428 to base 420.

Figure 9:
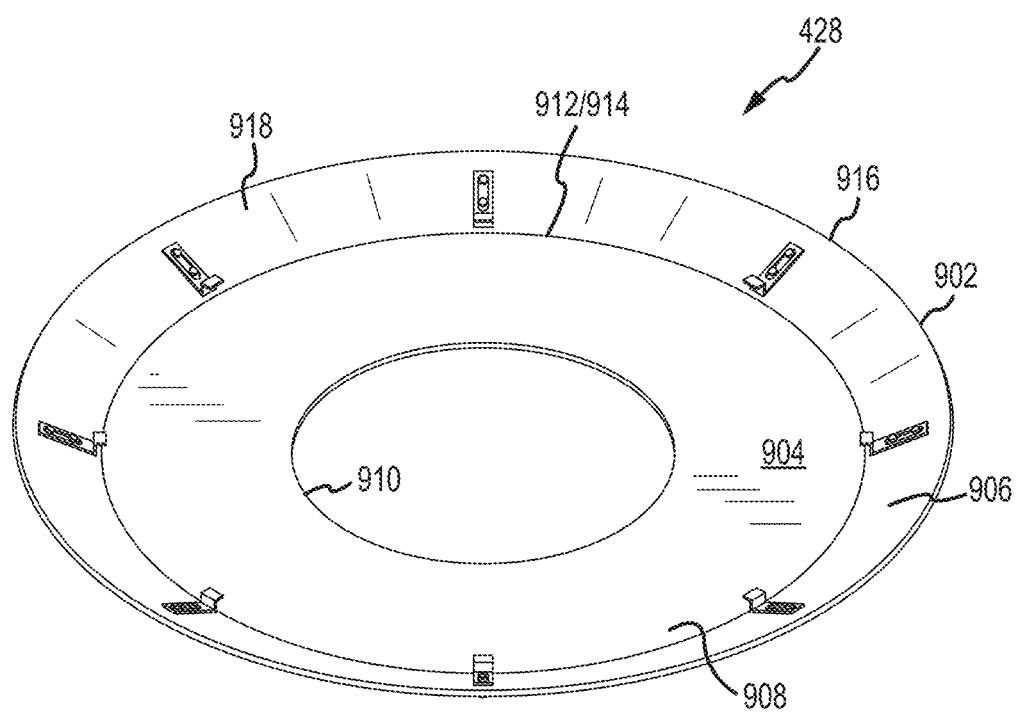
FIG. 9 illustrates a top perspective view of a radiation shield in accordance with at least one embodiments of the disclosure.
Figure 10:
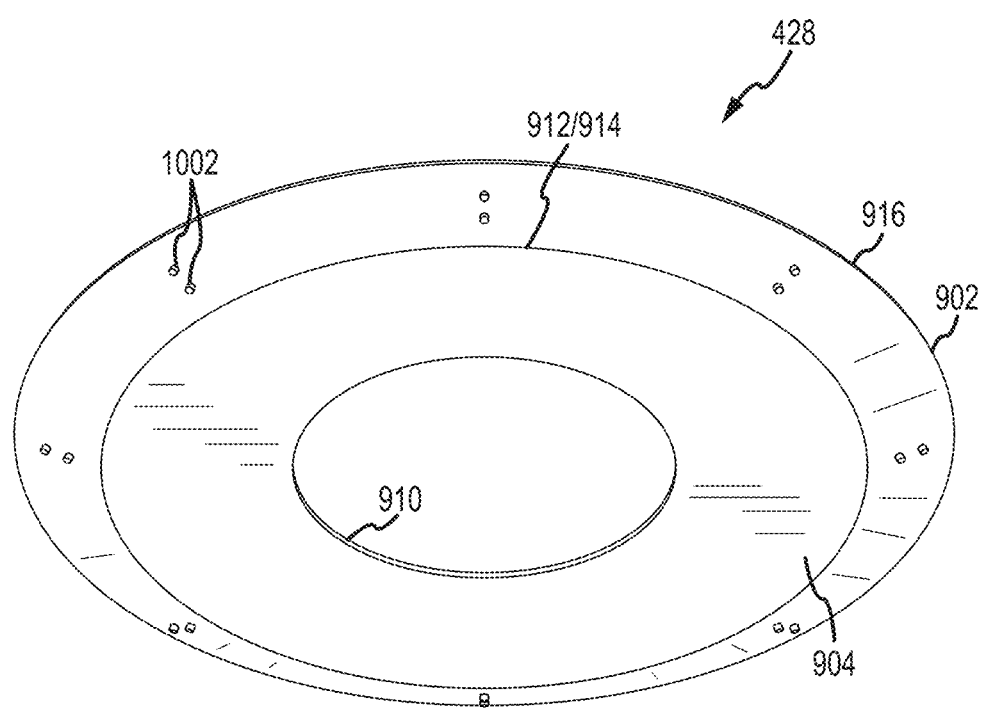
FIG. 10 illustrates a bottom perspective view of a radiation shield in accordance with at least one embodiments of the disclosure.

Turning now to FIGS. 9 and 10, radiation shield 428, including attachment devices 434, is illustrated in greater detail. In this example, radiation shield 428 includes a plate 902 including a first section 904 and a second section 906. First section 904 includes an annular disc 908 having an inner perimeter 910 and an outer perimeter 912. Second section 906 includes a hollow frusto shape and includes an inner perimeter 914, an outer perimeter 916, and a tapering surface 918 there between.

Inner perimeter 910 of plate 902 is configured to provide desired heat transfer from heater assembly 414. Inner perimeter 910 can have a diameter that ranges from about 100 mm to about 110 mm, about 160 mm to about 170 mm, or about 240 mm to about 250 mm. Inner perimeter can be designed to allow one or more lift pins 436, 438 to be received within an opening defined by inner perimeter 910. As illustrated in the figures, inner perimeter 910 does not contact heater assembly 414. This lack of contact of by inner perimeter 910 to heater assembly 414 is thought to facilitate desired heat conduction/radiation flux from heater assembly 414, which provides desired temperature uniformity across surface 426.

Second section 906 connects to first section 904 at first section outer perimeter 912 and second section 906 inner perimeter 914. The hollow frusto shape can form an angle with first section of between about 15 and 90 degrees, about 25 and 65 degrees, or between about 30 and 80, degrees.

Figure 11:
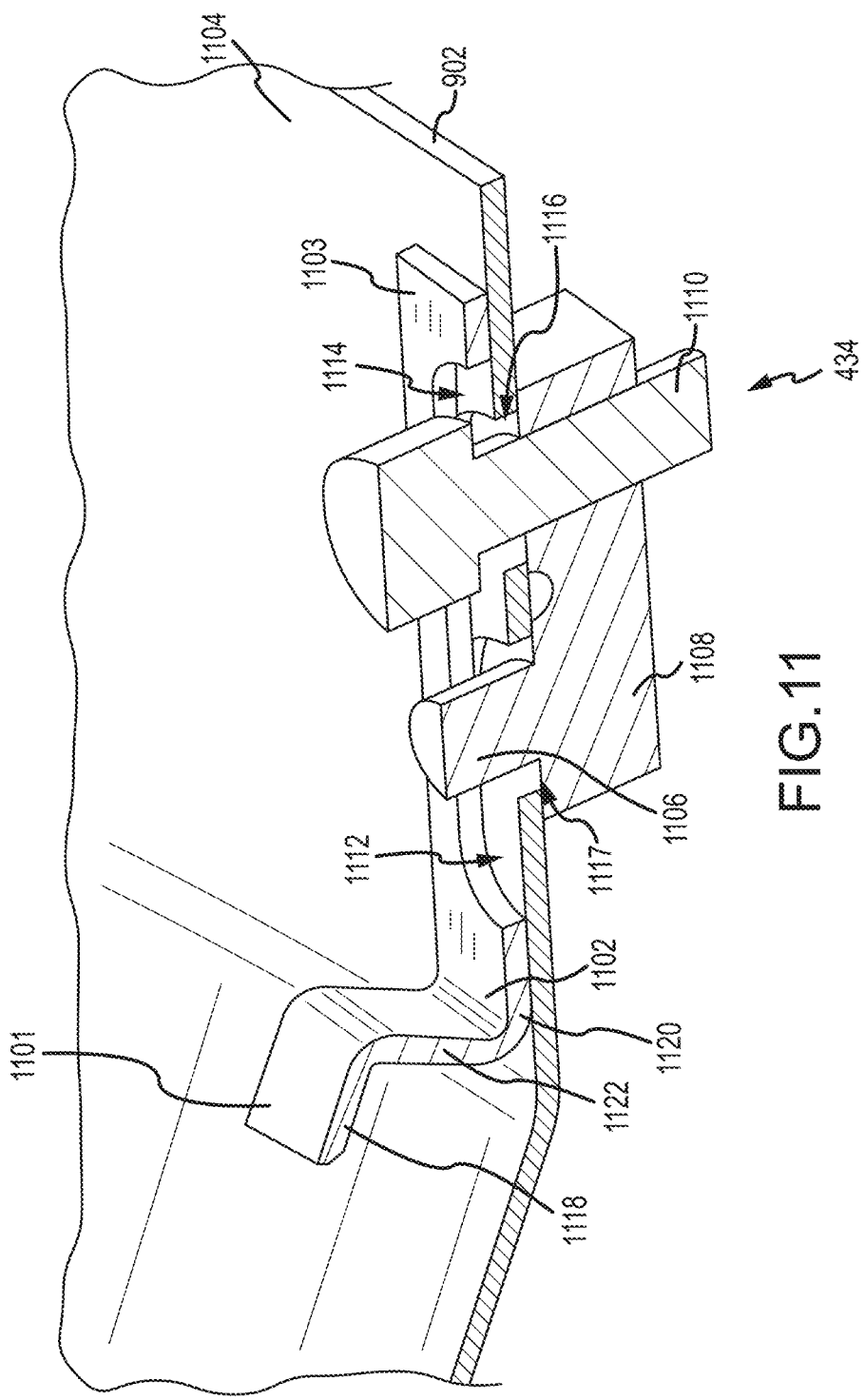
FIG. 11 illustrates an attachment device in accordance with at least one embodiments of the disclosure.

An exemplary attachment device 434 is illustrated in FIG. 11. Exemplary attachment device 434 includes a slidable member 1102 that includes a first end 1101 that engages with a portion of base 420 and a second end 1103 that engages with and attaches to plate 902. First end 1101 can include a first section 1118 that rests on ledge 702, a second section 1120 that contacts plate 902, and a third section 1122 that spans there between. Slidable member 1102 can be of, for example, a solid piece of stainless steel, Hastelloy®, or titanium.

As shown in FIG. 11, slidable member 1102 can slide along a top surface 1104 of second section 906 from a first position that engages radiation shield with base 420 to a second position that allows radiation shield to be disengaged and removed from base 420. Slidable member 1102 can include one or more recess 1112, 1114 to, for example, receive alignment pins 1106 and/or fasteners 1110. Fastener 1110 can be used to (e.g., removably) couple slidable member to radiation shield 428 and hold slidable member 1102 in place. Fastener 1110 can include any suitable fastener, such as a threaded fastener (e.g., bolt or screw), rivet, or the like. Fastener 1110 can be received within an opening 1116 of radiation shield 428 and recess 1114 of slidable member 1102. Fastener 1110 can engage directly with plate 902, with a block 1108 that can be part of attachment device 434, rivets 1002, illustrated in FIG. 10, or other suitable structure.

Alignment pin 1106 can be a stand-alone structure or be part of another structure, such as a block 1108. In the illustrated example, alignment pin 1106 is received within an opening 1117 of radiation shield 428 and within recess 1112.

Radiation shield 428 may be formed from any suitable material. Non-limiting examples include aluminum, stainless steel, ceramic, and titanium. Further, it will be appreciated that radiation shield 428 may be formed in any suitable manner. In some embodiments, radiation shield 428 may be formed by metal spinning. Other suitable fabrication techniques include casting, stamping, and turning. In some embodiments, radiation shield 428 may include suitable surface treatments and/or surface finishes configured to alter one or more radiation reflectivity characteristics of the material from which it is formed. Such treatments and finishes may be configured to reflect thermal radiation locally (e.g., toward susceptor heater assembly 414, in some examples) or globally. For example, radiation shield 428 may include a highly polished and/or passivated surface adapted to reflect thermal radiation in some embodiments. Additionally or alternatively, in some embodiments, radiation shield 428 may include surface treatments configured to reflect one or more wavelengths of infrared radiation. Further, in some embodiments, radiation shield 428 may be assembled by any suitable technique. For example, in some embodiments, radiation shield sub-assemblies may be welded together or removably connected together.

Figure 14:
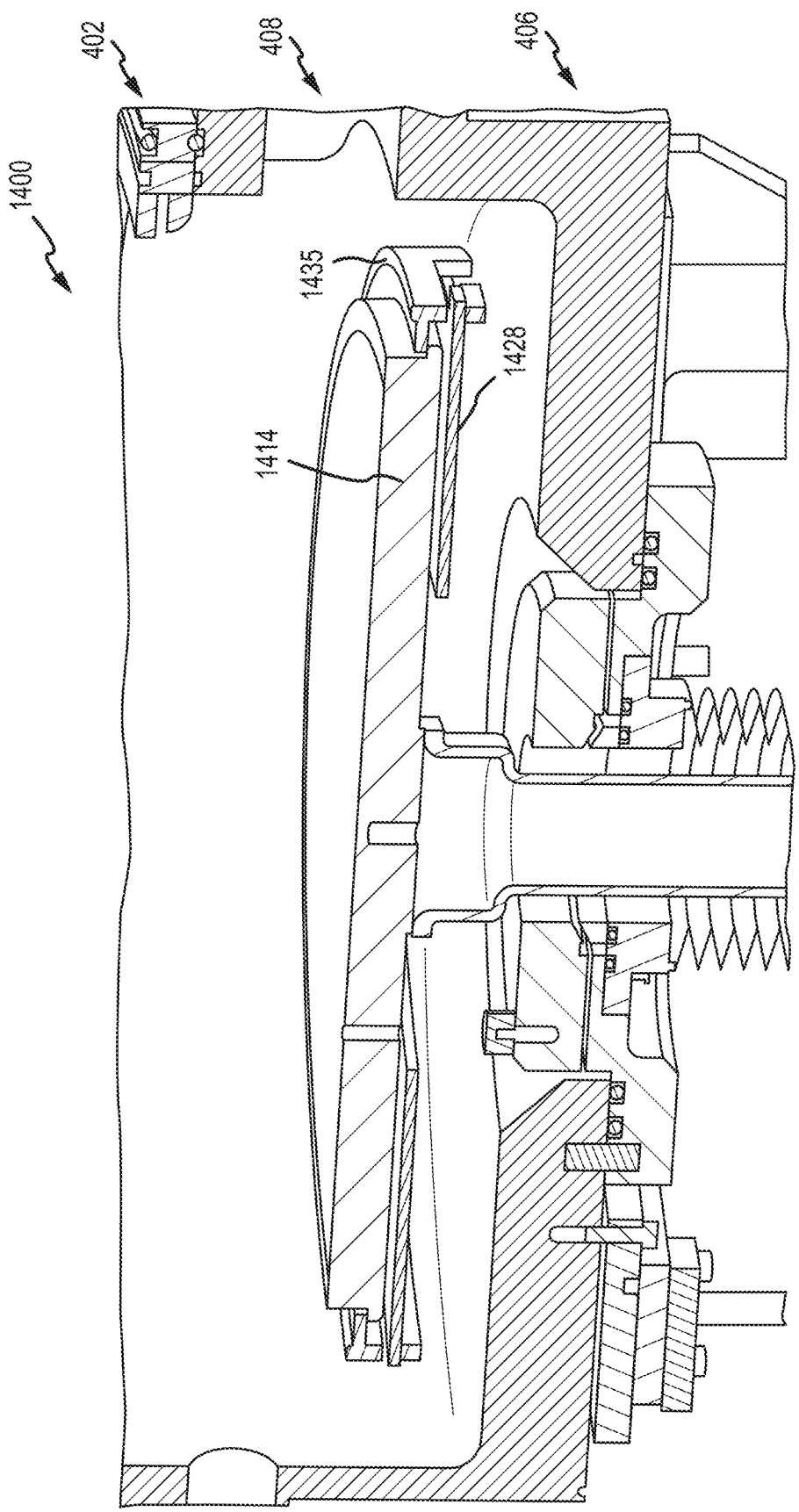
FIG. 14 illustrates a portion of another reactor including a radiation shield in accordance with at least one embodiment of the disclosure.

Turning now to FIG. 14, a cross-sectional view of a portion of another reactor 1400 in accordance with additional embodiments of the disclosure is illustrated. Reactor 1400 can be the same or similar to reactor 400, wherein radiation shield 428 is replaced with a radiation shield 1428, isolation device 435 is replaced with a flow control ring 1435, and wherein susceptor heater assembly 1414 can be the same or similar to susceptor heater assembly 414.

Figure 15:
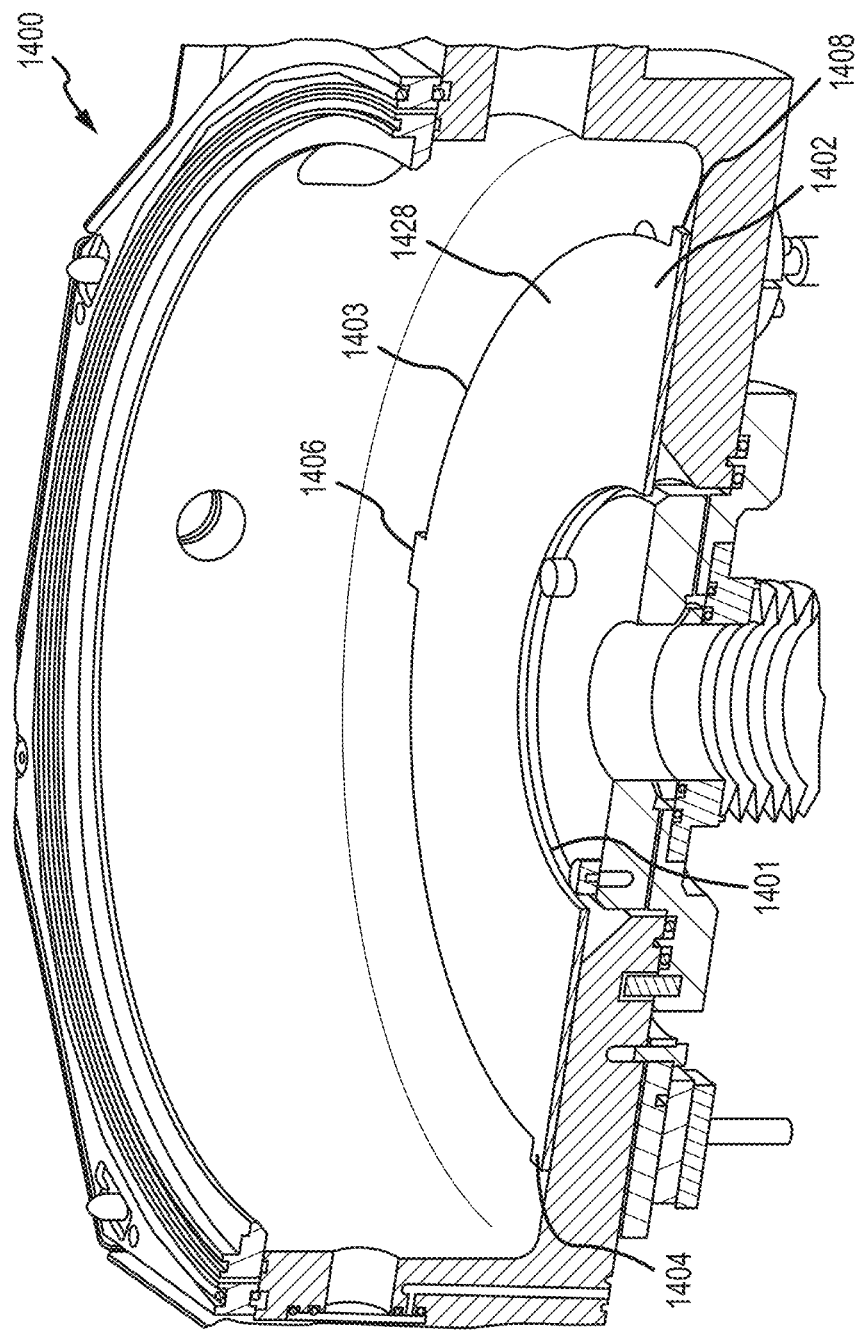
FIG. 15 illustrates a portion of the reactor illustrated in FIG. 14 in accordance with at least one embodiment of the disclosure.

FIG. 15 illustrates reactor 1400 with susceptor heater assembly 1414 removed, as may be the case when installing radiation shield 1428. Radiation shield 1428 includes a plate 1402 that is substantially planar and substantially annular, having an inner diameter 1401 and an outer diameter 1403. Inner diameter can range from about 80 mm to about 90 mm, about 160 mm to about 170 mm, or about 240 mm to about 250 mm. Outer diameter 1403 can range from about 300 mm to about 400 mm, about 450 mm to about 500, or about 500 to about 600. Similar to radiation shield 428, inner diameter 1401 can be large enough to receive lift pins, such as lift pins 436, 438 described above. Radiation shield 1428 and/or plate 1402 can also include one or more protrusions 1404-1408 extending from the outer diameter. In the illustrated example, although three protrusions are illustrated in cross-sectional view, radiation shield 1428 can include any suitable number of protrusions. The illustrated example would include four protrusions. The protrusions can be used to attach the plate 1402 to, for example, flow control ring 1435, as illustrated in FIG. 14. Plate 1402 can be formed of, for example, aluminum, stainless steel, ceramic, such as quartz, and/or titanium. Using a ceramic, such as quartz may be particularly desirable to minimize any particle formation within reactor 1400.

Figure 16:
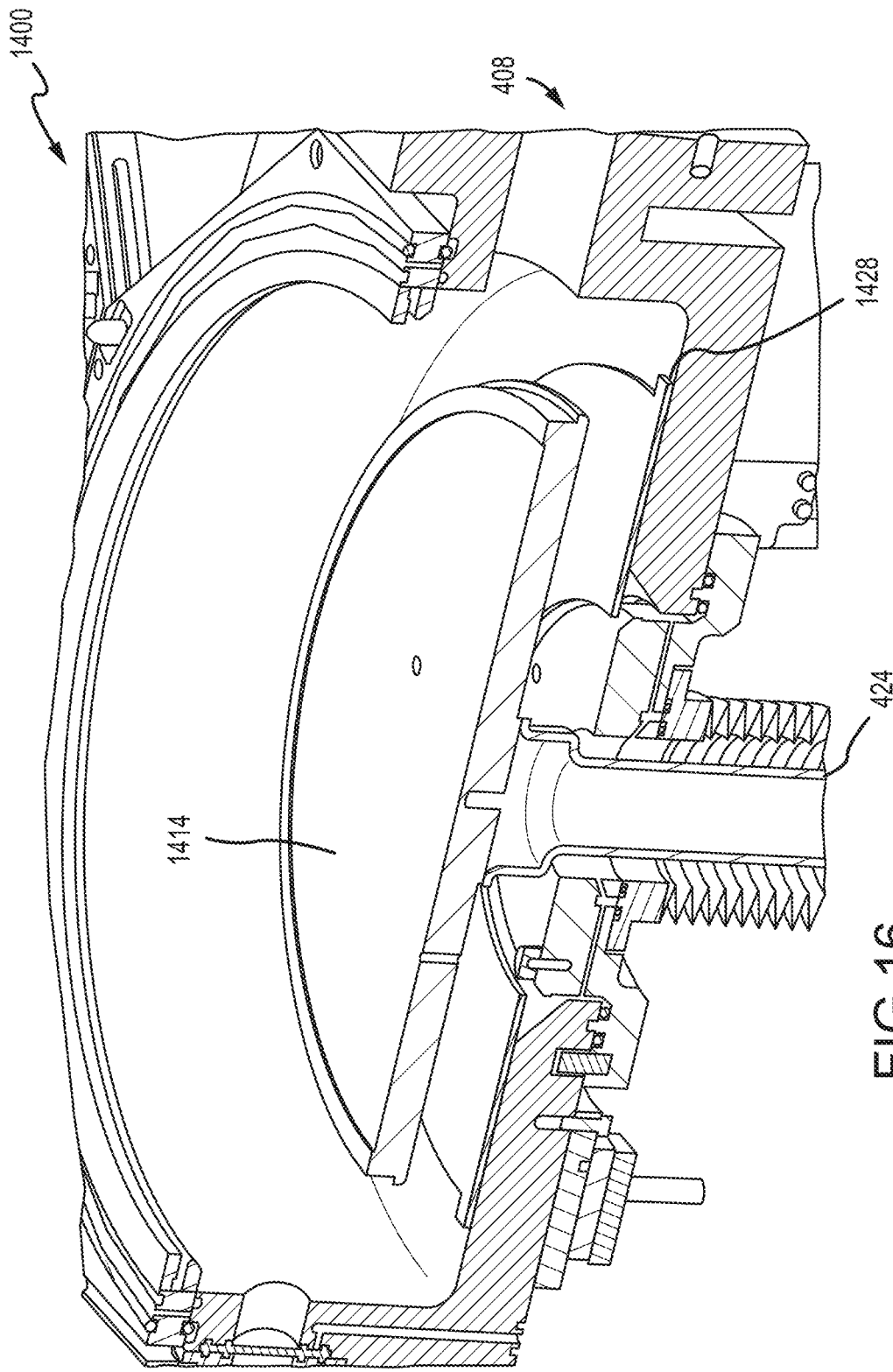
FIG. 16 illustrates the reactor illustrated in FIG. 14 prior to attachment of the flow control ring in accordance with at least one embodiment of the disclosure.

FIG. 16 illustrates a next step in an assembly process, wherein susceptor heater assembly 1414 has been added to the reactor. As noted above, susceptor heater assembly 1414 can be the same or similar to susceptor heater assembly 414, and can optionally include a cap as described above.

Figure 17:
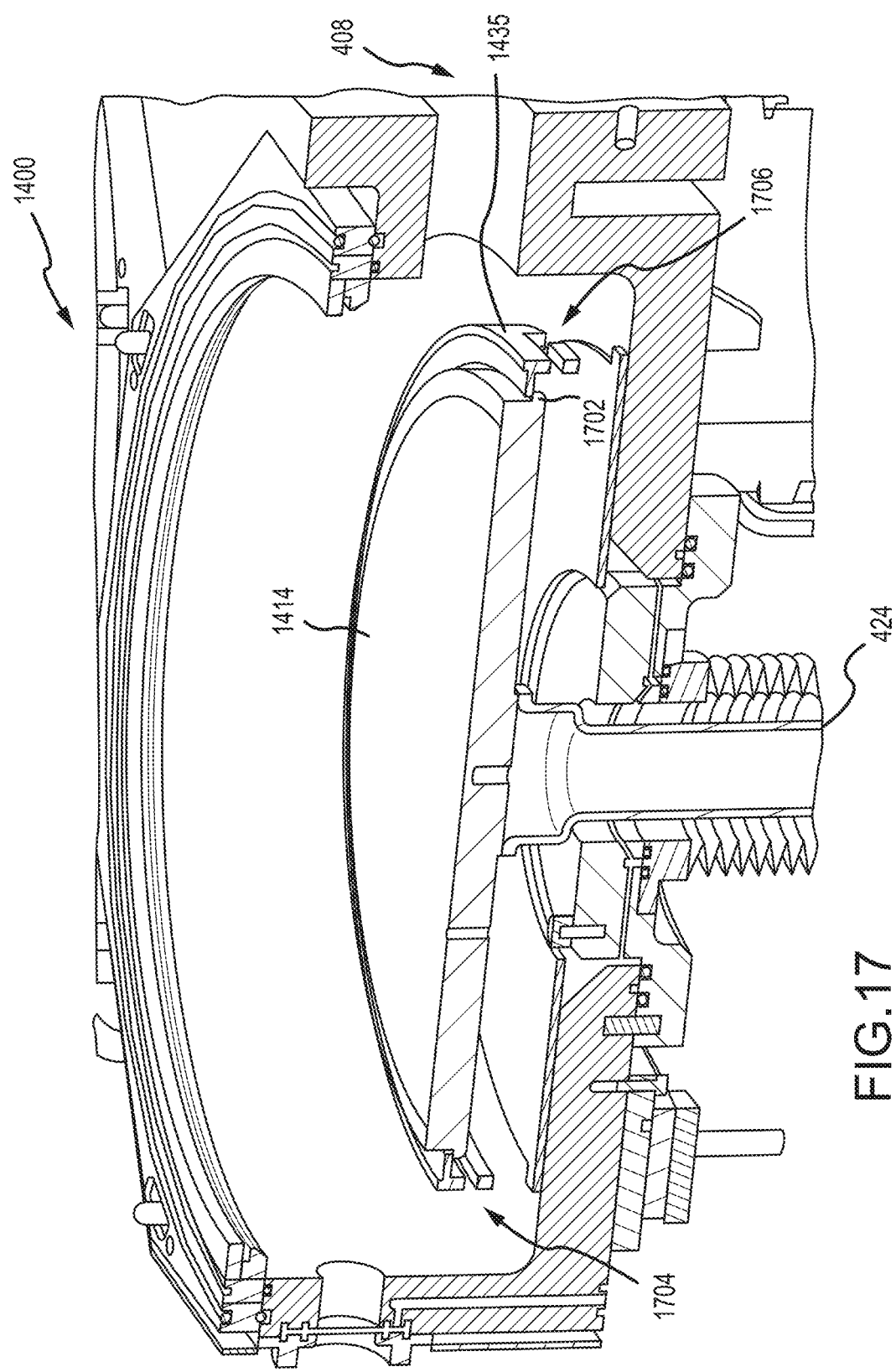
FIG. 17 illustrates the reactor illustrated in FIG. 14 prior to attachment of the radiation shield in accordance with at least one embodiment of the disclosure.

FIG. 17 illustrates another step in an assembly process, in which flow control ring 1435 has been coupled to susceptor heater assembly 1414. In the illustrated example, flow control ring 1435 rests on a ledge 1702 of susceptor heater assembly 1414. As noted above, flow control ring 1435 can facilitate formation of a tortuous path for gas to flow between upper region 402 and lower region 406. Flow control ring 1435 can be formed of, for example, quartz.

Figure 18:
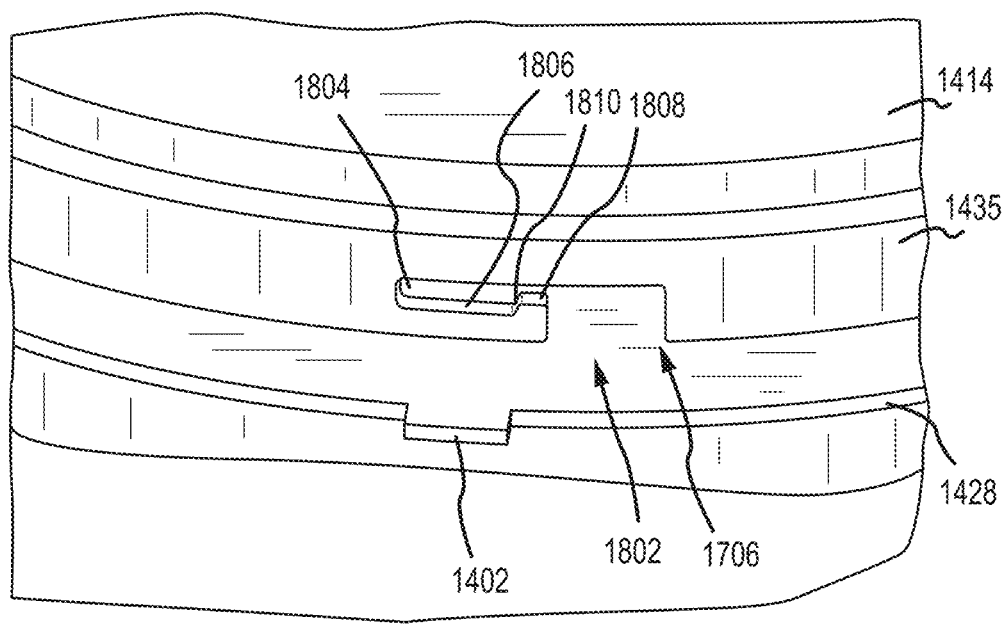
FIG. 18 illustrates a close-up view of portions of the reactor illustrated in FIG. 14 prior to attachment of the radiation shield to the flow control ring in accordance with at least one embodiment of the disclosure.
Figure 19:
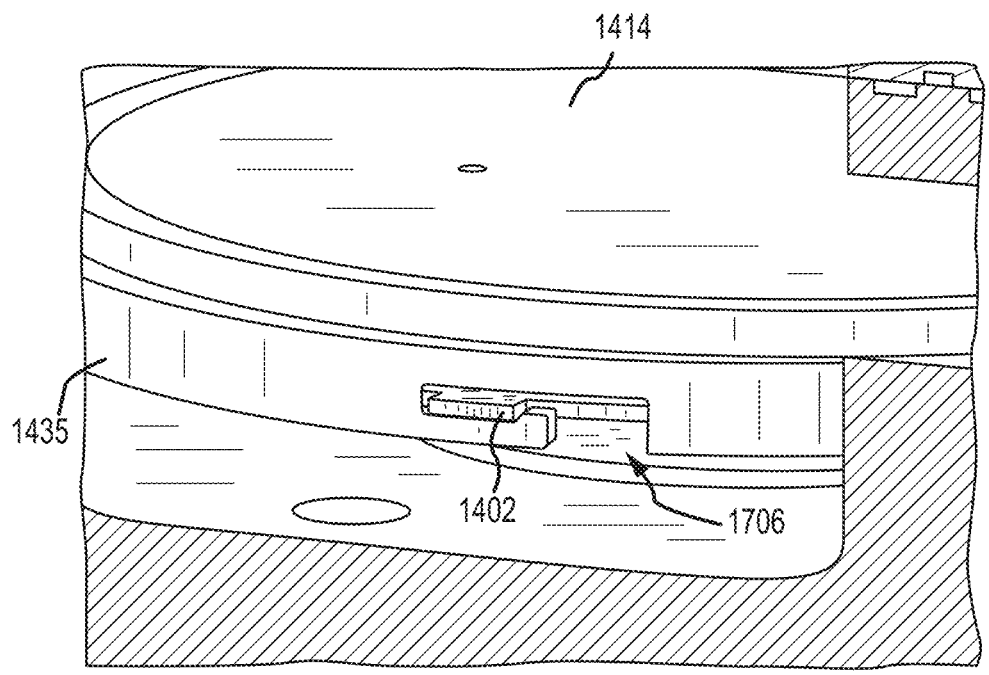
FIGS. 19 and 20 illustrate close-up views of portions of the reactor illustrated in FIG. 14.
Figure 20:
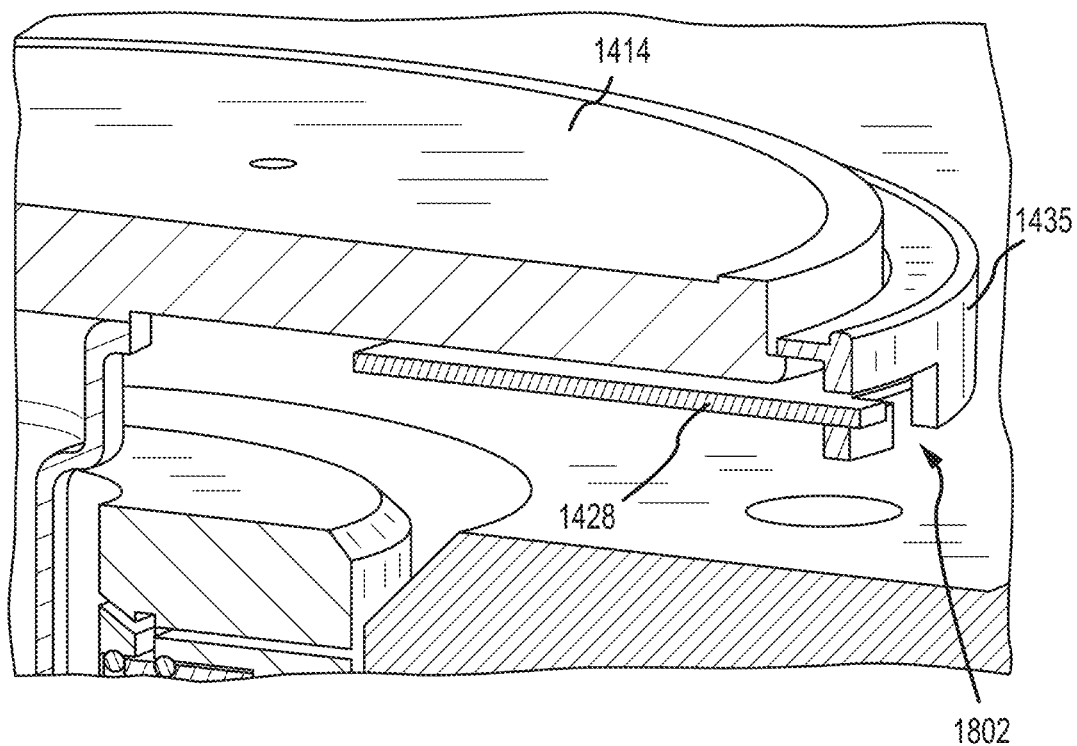

In the illustrated examples, flow control ring 1435 includes one or more notches 1704, 1706 to receive one or more protrusions 1402-1408, as illustrated in FIGS. 17-20. As best shown in FIGS. 18 and 19, notches 1704 and 1706 can include a first section 1802 to receive a protrusion and a second section 1804 to retain the protrusion (e.g., protrusion 1404, 1406, 1408). Second section 1804 can includes a first surface 1806, a second surface 1808, and a third surface 1810 spanning there between. Third surface 1810 can be tapered, as illustrated in FIG. 18. This allows attachment of radiation shield 1428 to flow control ring 1435 and/or susceptor heater assembly 1414 without use of separate (e.g., metal) fasteners.

In some settings, embodiments of radiation shields disclosed herein may reduce power consumed by a heater included in a susceptor or even with the susceptor separated from the heater. Heat lost from the susceptor heater assembly may cause the power consumed by the heater, and thus the heater temperature, to necessarily increase. Accordingly, it will be appreciated that radiation shielding according to the disclosed embodiments may reduce heater power consumption, which may increase heater service life, or to increase the ultimate substrate temperature for the same heater temperature, since more heat from the heater is directed into the susceptor heater assembly and substrate.

Further, in some settings, embodiments of radiation shields disclosed herein may enhance within-substrate temperature uniformity. Accordingly, shielding the susceptor heater assembly may, in some examples, decrease within-substrate temperature non-uniformities. This potentially may enhance substrate processing quality, and may enhance downstream substrate processing quality as well.

Figure 12:
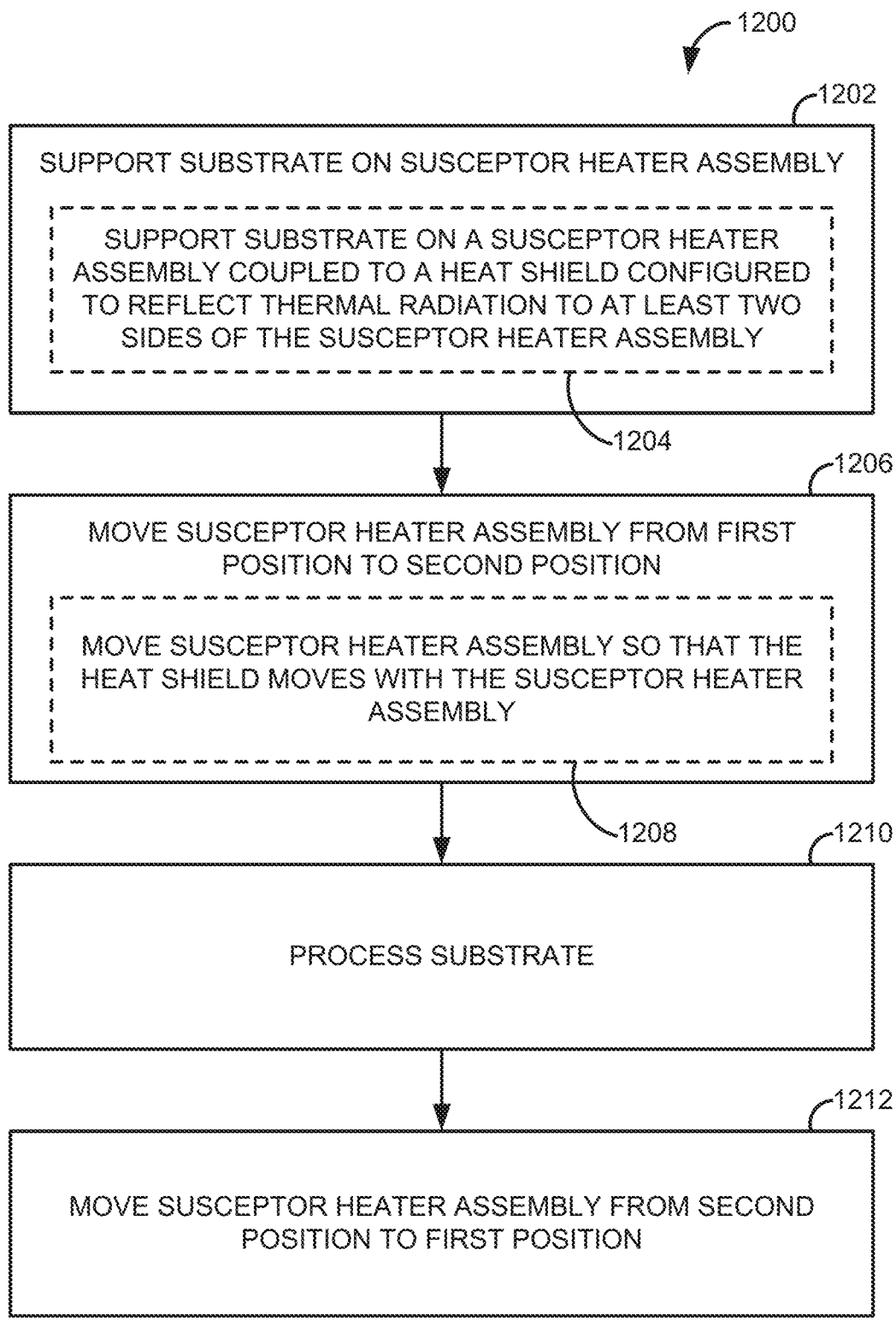
FIG. 12 illustrates a method in accordance with at least one embodiment of the disclosure.

It will be understood that the hardware described herein may be used when processing substrates in a substrate processing chamber of a reactor (e.g., reactor 400). FIG. 12 illustrates a flow chart for an embodiment of a method 1200 for processing a substrate in a substrate processing chamber. Method 1200 may be performed by any suitable hardware and software, such as described herein. It will be appreciated that portions of the processes described in method 1200 may be omitted, reordered, and/or supplemented without departing from the scope of the present disclosure.

At 1202, method 1200 includes supporting a substrate on a susceptor heater assembly. In some embodiments, method 1200 may include, at 1204, supporting a substrate on a susceptor heater assembly coupled to a radiation shield configured to reflect thermal radiation to at least two sides of the susceptor heater assembly. At 1206, method 1200 includes moving the susceptor heater assembly from a first position to a second position. In some embodiments, method 1200 may include, at 1208, moving the susceptor heater assembly so that a radiation shield moves with the susceptor heater assembly. At 1210, method 1200 includes processing the substrate. At 1212, method 1200 includes moving the susceptor heater assembly from the second position to the first position.

Embodiments of method 1200 may be performed by a system process controller comprising a data-handing subsystem comprising instructions executable by a logic subsystem to perform the processes described herein. Any suitable system process controller may be employed without departing from the scope of the present disclosure.

For example, a system process controller (e.g., controller 1300 illustrated in FIG. 13) may be provided for controlling the example substrate processing portion 404 and/or reactor 400—e.g., to perform methods disclosed herein. The system process controller may operate process module control subsystems, such as gas control subsystems, pressure control subsystems, temperature control subsystems, electrical control subsystems, and mechanical control subsystems. Such control subsystems may receive various signals provided by sensors, relays, and controllers and make suitable adjustments in response.

The system process controller comprises a computing system that includes a data-holding subsystem and a logic subsystem. The data-holding subsystem may include one or more physical, non-transitory, devices configured to hold data and/or instructions executable by the logic subsystem to implement the methods and processes described herein. The logic subsystem may include one or more physical devices configured to execute one or more instructions stored in the data-holding subsystem. The logic subsystem may include one or more processors that are configured to execute software instructions.

In some embodiments, such instructions may control the execution of process recipes. Generally, a process recipe includes a sequential description of process parameters used to process a substrate, such parameters including time, temperature, pressure, and concentration, etc., as well as various parameters describing electrical, mechanical, and environmental aspects of the tool during substrate processing. The instructions may also control the execution of various maintenance recipes used during maintenance procedures and the like. In some embodiments, such instructions may be stored on removable computer-readable storage media, which may be used to store and/or transfer data and/or instructions executable to implement the methods and processes described herein. It will be appreciated that any suitable removable computer-readable storage media may be employed without departing from the scope of the present disclosure. Non-limiting examples include DVDs, CD-ROMs, floppy discs, and flash drives.

Figure 13:
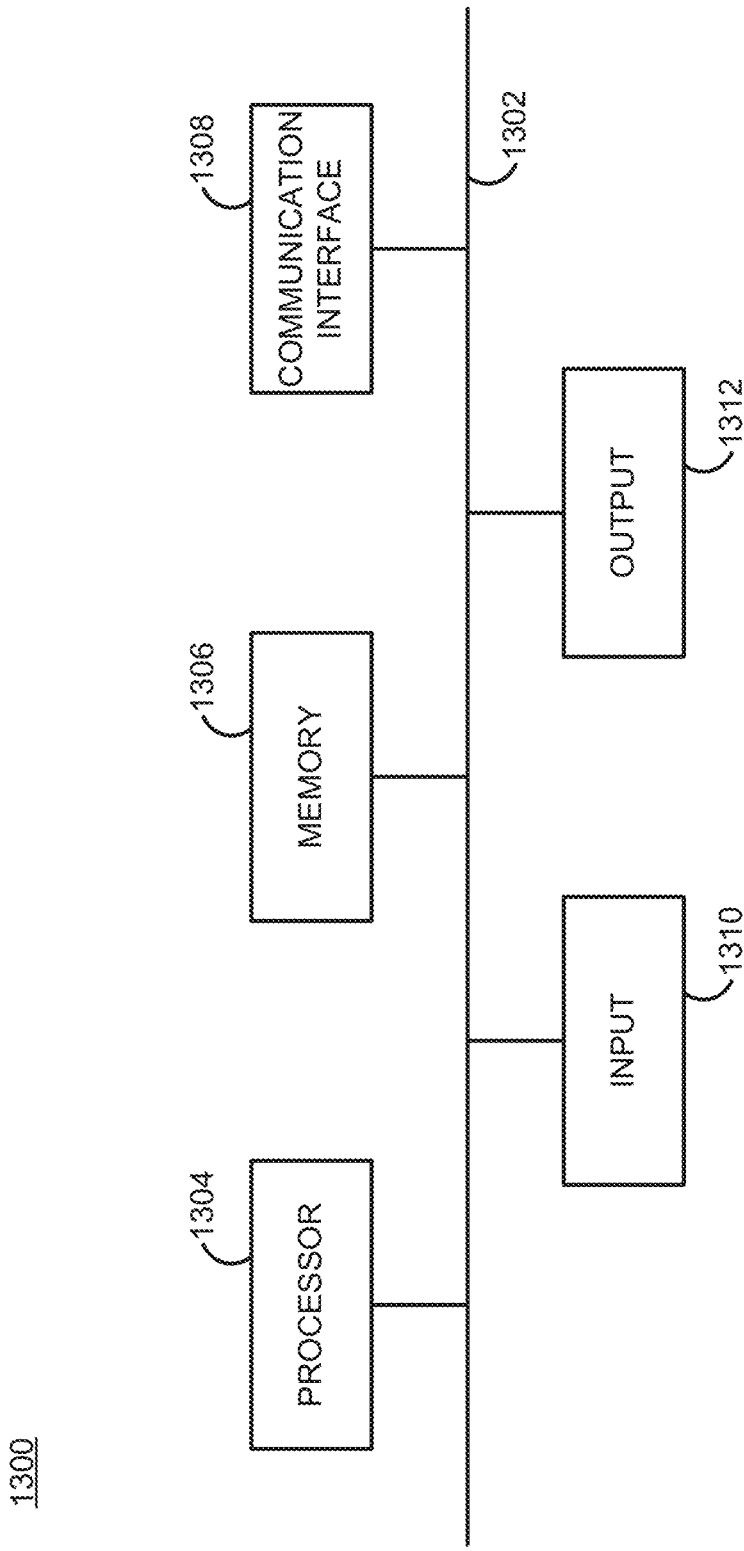
FIG. 13 illustrates a system process controller in accordance with at least one embodiment of the disclosure.

Turning now to FIG. 13, controller 1300 can be configured to perform one or more or all method steps of a method described herein. Exemplary controller 1300 includes a bus 1302 interconnecting a processor 1304, a memory 1306, an optional communication interface 1308, an input device 1310, and an output device 1312. Bus 1302 enables communication among the components of controller 1300. Processor 1304 can include one or more processing units or microprocessors that interpret and execute coded instructions. In other implementations, processor 1304 can be implemented by or include one or more application-specific integrated circuits (ASICs), field programmable gate arrays (FPGAs), or the like.

Memory 1306 can include a random access memory (RAM) or another type of dynamic storage device that stores information and instructions for execution by the processor 1304. Memory 1306 can also include a read-only memory (ROM) or another type of static storage device that stores static information and instructions for processor 1304. Memory 1306 can additionally or alternatively include other types of magnetic or optical recording medium and its corresponding drive for storing information and/or instructions. As used herein, the term "memory" is broadly used to include registers, buffers, and other data constructs configured to hold data.

Communication interface 1308 can include protocol stacks for processing data transmitted via a data protocol now known or to be developed. Communication interface 1308 can include transceiver-like devices and antenna that enables controller 1300 to communicate radio frequency with other devices and/or systems. Communication interface 1308 can additionally or alternatively include interfaces, ports, or connectors to other devices.

Input 1310 can include one or more devices that permit an operator to enter information to controller 1300, such as a keyboard, a keypad, a mouse, a pen, a touch-sensitive pad or screen, a microphone, one or more biometric mechanisms, and the like. Output 1312 can include one or more devices that outputs information to the operator, such as a display, a printer port, a speaker, or the like.

As described herein, controller 1300 can perform certain operations in response to processor 1304 executing software instructions contained in a computer-readable medium, such as memory 1306. A computer-readable medium may be defined as a physical or logical memory device. A logical memory device can include memory space within a single physical memory device or spread across multiple physical memory devices. The software instructions can be read into memory 1306 from another computer-readable medium or from another device via a communication interface 1308. The software instructions contained in memory 1306 can cause processor 1304 to perform processes/methods described herein. Alternatively, hardwired circuitry can be used in place of or in combination with software instructions to implement processes described herein. Thus, implementations described herein are not limited to any specific combination of hardware circuitry and software.

Although exemplary embodiments of the present disclosure are set forth herein, it should be appreciated that the disclosure is not so limited. For example, although the systems and methods are described in connection with various specific chemistries, the disclosure is not necessarily limited to these chemistries. Various modifications, variations, and enhancements of the systems and methods set forth herein can be made without departing from the spirit and scope of the present disclosure.

What is claimed is:

1. An apparatus for supporting a substrate during a reaction process, the apparatus comprising:
   a susceptor heater assembly comprising a substrate support surface, a base, and a side surface; and
   a radiation shield coupled to the susceptor heater assembly, wherein the radiation shield is positioned opposite the substrate support surface proximate to a bottom surface of the base, wherein the radiation shield comprises a plate having an outer diameter and an inner diameter, and wherein the plate is coupled to the side surface of the susceptor heater assembly at the outer diameter and is spaced apart a distance at the inner diameter from a movable pedestal adapted to vertically position the susceptor heater assembly in the reaction chamber.

2. The apparatus of claim 1, further comprising a flow control ring, wherein the radiation shield is coupled to the susceptor heater assembly by the flow control ring, wherein the flow control ring is coupled to the radiation shield and the side surface of the susceptor heater assembly and extends along a perimeter of the susceptor heater assembly.

3. The apparatus of claim 2, wherein the radiation shield includes one or more protrusions extending from the outer diameter of the plate and used to couple the radiation shield to the flow control ring.

4. The apparatus of claim 3, wherein the flow control ring comprises one or more notches to receive the one or more protrusions to couple the radiation shield to the flow control ring.

5. The apparatus of claim 4, wherein each of the one or more notches includes a first section to receive one of the one or more protrusions and a second section to retain the one of the one or more protrusions.

6. The apparatus of claim 5, wherein the second section includes a first surface, a second surface, and a third surface spanning therebetween, and wherein the third surface is tapered, whereby the radiation shield is attached to the flow control ring without separate fasteners.

7. The apparatus of claim 2, wherein the radiation shield includes an upper surface facing the bottom surface of the base that has a surface treatment configured to reflect one or more wavelengths of infrared radiation.

8. The apparatus of claim 2, wherein the side surface includes a ledge and wherein the flow control ring is configured to rest upon the ledge when the flow control ring is coupled to the base of the susceptor heater assembly.

9. The apparatus of claim 1, further comprising an attachment device coupled to the plate, wherein the attachment device is configured to removably couple the plate to the side surface of the susceptor heater assembly.

10. The apparatus of claim 9, wherein the plate comprises a first section and a second section, wherein the first section comprises an annular disc having an inner perimeter and an outer perimeter, and wherein the second section comprising a hollow frusto shape.

11. The apparatus of claim 10, wherein the attachment device is coupled to the second section of the plate.

12. The apparatus of claim 11, wherein the attachment device comprises a slidable member configured to slide along the second section of the plate.

13. An apparatus for supporting a substrate during a reaction process, the apparatus comprising:
    a susceptor heater assembly comprising a substrate support surface, a base, and a side surface;
    a flow control ring coupled to the side surface and extending along a perimeter of the susceptor heater assembly; and
    a radiation shield coupled to the flow control ring, wherein the radiation shield is positioned opposite the substrate support surface proximate to a bottom surface of the base, and wherein the radiation shield comprises a plate, wherein the plate is supported at an outer diameter by the flow control ring, wherein a gap is provided between the plate and the bottom surface of the base of the susceptor heater assembly, and wherein the plate does not contact the heater assembly at an inner diameter.

14. The apparatus of claim 13, wherein the gap is retained at the inner diameter of the plate.

15. The apparatus of claim 13, wherein the radiation shield comprises one or more protrusions extending from the outer diameter of the plate and used to couple the radiation shield to the flow control ring.

16. The apparatus of claim 15, wherein the flow control ring comprises one or more notches to receive the one or more protrusions to couple the radiation shield to the flow control ring.

17. The apparatus of claim 16, wherein each of the one or more notches includes a first section to receive one of the one or more protrusions and a second section to retain the one of the one or more protrusions.

\* \* \* \* \*